(12) United States Patent
Kim et al.

(10) Patent No.: US 9,818,538 B2
(45) Date of Patent: Nov. 14, 2017

(54) MULTILAYER CERAMIC ELECTRONIC COMPONENT AND BOARD FOR MOUNTING THEREOF

(71) Applicant: SAMSUNG ELECTRO-MECHANICS CO., LTD., Suwon-Si, Gyeonggi-Do (KR)

(72) Inventors: Hong Seok Kim, Suwon-Si (KR); Chung Eun Lee, Suwon-Si (KR); Chang Hoon Kim, Suwon-Si (KR); Doo Young Kim, Suwon-Si (KR)

(73) Assignee: SAMSUNG ELECTRO-MECHANICS CO., LTD., Suwon-si, Gyeonggi-do (KR)

(*) Notice: Subject to any disclaimer, the term of this patent is extended or adjusted under 35 U.S.C. 154(b) by 35 days.

(21) Appl. No.: 14/485,247

(22) Filed: Sep. 12, 2014

(65) Prior Publication Data
US 2015/0332852 A1    Nov. 19, 2015

(30) Foreign Application Priority Data

May 19, 2014  (KR) .................. 10-2014-0059635

(51) Int. Cl.
| | |
|---|---|
| *H01G 4/06* | (2006.01) |
| *H01G 4/12* | (2006.01) |
| *H01G 4/012* | (2006.01) |
| *H01G 4/248* | (2006.01) |
| *H05K 1/18* | (2006.01) |

(Continued)

(52) U.S. Cl.
CPC ............. *H01G 4/12* (2013.01); *H01G 2/065* (2013.01); *H01G 4/012* (2013.01); *H01G 4/248* (2013.01); *H01G 4/30* (2013.01); *H05K 1/111* (2013.01); *H05K 1/181* (2013.01); *H01G 4/232* (2013.01); *H05K 3/3442* (2013.01);

(Continued)

(58) Field of Classification Search
CPC ........ H01G 4/30; H01G 4/1227; H01G 28/55; H01G 4/12; H01G 4/012; H01G 4/248; H01G 2/065; H01G 4/232; H01L 28/55; H05K 1/181; H05K 1/111; H05K 3/3442; H05K 2201/10015; H05K 2201/10636; Y02P 70/611
USPC ............................. 361/311–321.2, 303–305
See application file for complete search history.

(56) References Cited

U.S. PATENT DOCUMENTS

| | | | | |
|---|---|---|---|---|
| 5,812,363 | A  * | 9/1998 | Kuroda | ............... H01G 4/30 |
| | | | | 361/306.3 |
| 6,366,444 | B1 * | 4/2002 | Yagi | ............... H01F 41/043 |
| | | | | 361/306.1 |

(Continued)

FOREIGN PATENT DOCUMENTS

| | | |
|---|---|---|
| JP | 2013-093374 A | 5/2013 |
| KR | 2009-0032766 A | 4/2009 |
| KR | 10-1069989 B1 | 10/2011 |

*Primary Examiner* — Pete Lee
(74) *Attorney, Agent, or Firm* — McDermott Will & Emery LLP

(57) ABSTRACT

A multilayer ceramic electronic component may include a ceramic body including an active part in which dielectric layers and internal electrodes are alternately disposed, an upper cover part disposed on the active part, and a lower cover part disposed below the active part, a buffer layer disposed in at least one of the upper and lower cover parts, and external electrodes disposed on end surfaces of the ceramic body. The buffer layer may contain a conductive metal in a content of 1 to 40 vol %.

6 Claims, 4 Drawing Sheets

(51) Int. Cl.
  *H05K 1/11* (2006.01)
  *H01G 4/30* (2006.01)
  *H01G 2/06* (2006.01)
  H05K 3/34 (2006.01)
  *H01G 4/232* (2006.01)
(52) U.S. Cl.
  CPC .............. *H05K 2201/10015* (2013.01); *H05K 2201/10636* (2013.01); *Y02P 70/611* (2015.11)

(56) References Cited

U.S. PATENT DOCUMENTS

| | | | | |
|---|---|---|---|---|
| 7,394,646 | B2* | 7/2008 | Tonogai | H01G 4/30 361/303 |
| 7,580,241 | B2* | 8/2009 | Sakashita | C04B 35/462 361/306.1 |
| 8,537,521 | B2* | 9/2013 | Ando | B32B 18/00 29/25.41 |
| 2002/0027764 | A1* | 3/2002 | Kishimoto | H01G 2/12 361/321.2 |
| 2008/0013252 | A1* | 1/2008 | Nakano | H01G 4/06 361/311 |
| 2011/0056735 | A1 | 3/2011 | Lee et al. | |
| 2012/0218678 | A1* | 8/2012 | Satou | H01G 4/12 361/303 |
| 2013/0233606 | A1* | 9/2013 | Fujii | H05K 1/16 174/260 |

\* cited by examiner

MULTILAYER CERAMIC ELECTRONIC COMPONENT AND BOARD FOR MOUNTING THEREOF

CROSS-REFERENCE TO RELATED APPLICATION

This application claims the benefit of Korean Patent Application No. 10-2014-0059635 filed on May 19, 2014, with the Korean Intellectual Property Office, the disclosure of which is incorporated herein by reference.

BACKGROUND

The present disclosure relates to a multilayer ceramic electronic component and a board for mounting thereof.

In general, electronic components using a ceramic material, such as capacitors, inductors, piezoelectric elements, varistors, thermistors, and the like, include a ceramic body formed using a ceramic material, internal electrodes formed in the ceramic body, and external electrodes mounted on a surface of the ceramic body so as to be connected to the internal electrodes.

As various functions in fields requiring high reliability are digitalized and demands therefor are increased, multilayer ceramic electronic components are also required to have high reliability.

In addition, recently, thin multilayer ceramic electronic components have been mass-produced, and a demand for super high capacitance multilayer ceramic electronic components has been increased.

As a factor causing problems affecting high reliability of the thin and high capacitance multilayer ceramic electronic components as described above, there may be the occurrence of cracks, delamination, deterioration in withstand voltage characteristics, and the like, and vertical cracks caused due to a difference in a sintering shrinkage between dielectric layers and electrodes in the multilayer ceramic electronic component may also affect reliability of the multilayer ceramic electronic component.

Therefore, in order to improve reliability of multilayer ceramic electronic components, a difference in sintering shrinkage between dielectric layers and electrodes is required to decrease.

RELATED ART DOCUMENT

Korean Patent No. 10-1069989

SUMMARY

Some embodiments in the present disclosure may provide a multilayer ceramic electronic component and a board for mounting thereof.

According to some embodiments in the present disclosure, a multilayer ceramic electronic component may include an active part in which dielectric layers and internal electrodes are alternately disposed, an upper cover part disposed on the active part, and a lower cover part disposed below the active part. A buffer layer disposed in at least one of the upper and lower cover parts may contain a conductive metal in a content of 1 to 40 vol %.

A heat shrinkage rate of the buffer layer may be higher than that of the upper and lower cover parts and lower than that of an outermost internal electrode of the active part.

The buffer layer may contain a dielectric grain contained in the dielectric layer of the active part and a dielectric grain contained in the internal electrode.

According to some embodiments in the present disclosure, a board for mounting of a multilayer ceramic electronic component may include a printed circuit board provided with first and second electrode pads formed on the printed circuit board; and the multilayer ceramic electronic component described above, mounted on the printed circuit board.

BRIEF DESCRIPTION OF DRAWINGS

The above and other aspects, features and other advantages in the present disclosure will be more clearly understood from the following detailed description taken in conjunction with the accompanying drawings, in which.

DETAILED DESCRIPTION

Figure 1:
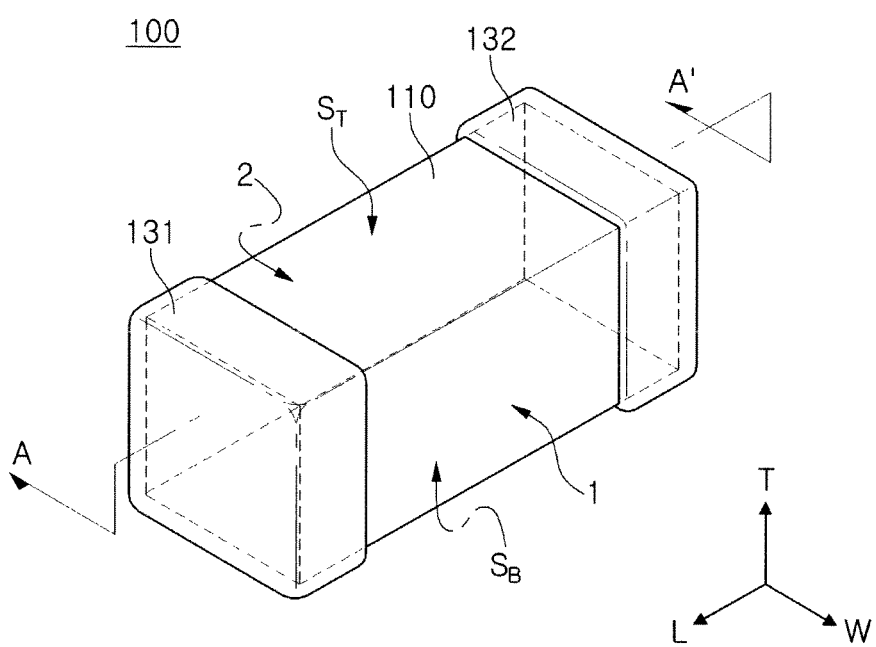
FIG. 1 is a perspective view illustrating a multilayer ceramic electronic component according to an exemplary embodiment in the present disclosure.

Exemplary embodiments in the present disclosure will now be described in detail with reference to the accompanying drawings.

The disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

Multilayer Ceramic Electronic Component

Figure 2:
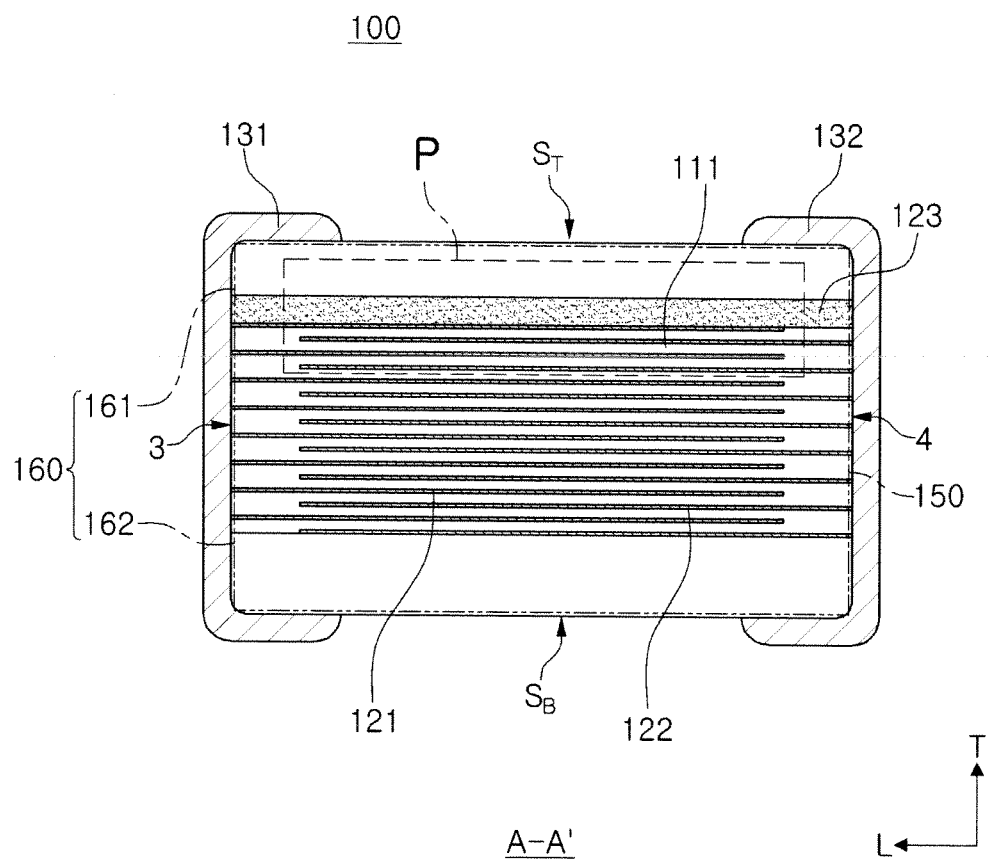
FIG. 2 is a cross-sectional view taken along line A-A' of FIG. 1.

FIG. 1 is a perspective view schematically illustrating a multilayer ceramic electronic component according to an embodiment in the present disclosure, and FIG. 2 is a cross-sectional view taken along line A-A' of FIG. 1.

Referring to FIG. 1, the multilayer ceramic electronic component 100 according to an embodiment in the present disclosure may include a ceramic body 110; and external electrodes 131 and 132.

According to an embodiment in the present disclosure, a T-direction illustrated in FIGS. 1 and 2 refers to a thickness direction of the ceramic body 110, an L-direction refers to a length direction of the ceramic body 110, and a W-direction refers to a width direction of the ceramic body 110.

The thickness (T) direction refers to a direction in which internal electrodes and dielectric layers are stacked.

Referring to FIGS. 1 and 2, the ceramic body 110 may have upper and lower surfaces $S_T$ and $S_B$ opposing each other in the thickness direction thereof, first and second side surfaces 1 and 2 opposing each other in the width direction thereof, and third and fourth end surfaces 3 and 4 opposing each other in the length direction thereof. A shape of the ceramic body 110 is not particularly limited. For example, although a shape of the ceramic body 110 is not a hexahedral shape having completely straight lines, the ceramic body may have a substantially hexahedral shape.

The ceramic body 110 may include a plurality of dielectric layers 111 and internal electrodes 121 and 122.

The ceramic body may include the internal electrodes 121 and 122 formed on the dielectric layers 111 and may include an active part 150 in which a plurality of dielectric layers including the internal electrode formed thereon are stacked and a cover part 160 disposed on upper and lower portions of the active part.

Unless otherwise described, the upper and lower portions and the upper and lower surfaces are not separately distinguishable in the ceramic body, and may refer to one portion and the other portion in the thickness direction and one surface and the other surfaces opposing each other in the thickness direction, respectively. In addition, the upper and lower surfaces may refer to first and second main surfaces of the ceramic body opposing each other in the thickness direction, respectively.

The internal electrode may include the first and second internal electrodes 121 and 122. The first and second internal electrodes 121 and 122 may be alternately disposed on the dielectric layers with each of the dielectric layers 111 interposed therebetween.

The first internal electrode 121 may be exposed to the third end surface 3 of the ceramic body in the length direction, and the second internal electrode 122 may be exposed to the fourth end surface 4 of the ceramic body in the length direction.

The first and second internal electrodes 121 and 122 may be formed using a conductive paste containing a conductive metal.

The conductive metal may be nickel (Ni), copper (Cu), palladium (Pd), or an alloy thereof, but is not limited thereto.

The external electrodes 131 and 132 may be disposed on the third and fourth end surfaces 3 and 4 of the ceramic body in the length direction to thereby be connected to the first and second internal electrodes 121 and 122.

The external electrode may include the first external electrode 131 and the second external electrode 132, and the first external electrode 131 may be connected to the first internal electrode 121, and the second external electrode 132 may be connected to the second internal electrode 122.

The external electrode may be formed by applying a conductive paste to the third and fourth end surfaces 3 and 4 of the ceramic body in the length direction to then be sintered, but a shape and formation method of the external electrode are not particularly limited.

The external electrodes 131 and 132 may be disposed on the third and fourth end surfaces 3 and 4 of the ceramic body in the length direction and extended to the first and second side surfaces 1 and 2 of the ceramic body in the width direction and the upper and lower surfaces $S_T$ and $S_B$ of the ceramic body opposing each other in the thickness direction.

According to an embodiment in the present disclosure, the dielectric layers 111 and the internal electrodes 121 and 122 may be stacked in the thickness (T) direction of the ceramic body as illustrated in FIG. 2.

The cover part 160 may be disposed on outer portions of outermost internal electrodes of the active part 150 in order to protect the active part 150 from external impacts.

The cover part may include an upper cover part 161 disposed on an upper portion of the active part 150 and a lower cover part 162 disposed on a lower portion of the active part 150.

According to an embodiment in the present disclosure, the upper and lower cover parts 161 and 162 may include a buffer layer 123 disposed therein.

The buffer layer 123 may be a shrinkage control part controlling a heat shrinkage rate between the active part 150 and the cover part 160 at the time of sintering the ceramic body 110.

In the case in which thicknesses of the internal electrodes and the dielectric layers are relatively reduced, a thickness of an active part may be decreased, and a thickness of a cover part may be increased.

Further, in order to implement a high capacitance multilayer ceramic capacitor, the number of stacked internal electrodes may be increased.

In the case in which the internal electrodes become relatively slimmed, and the multilayer ceramic capacitor has a relatively high degree of capacitance as described above, at the time of sintering the ceramic body, cracks may occur in the ceramic body due to a difference in a heat shrinkage rate between the internal electrode of the active part and the dielectric layer of the cover part.

The difference in the heat shrinkage rate between the internal electrode and the dielectric layer at the time of performing sintering may be caused due to a difference in a heat shrinkage rate between a metal and a ceramic.

In detail, as the internal electrodes are thinned as described above, the thickness of the active part is decreased and the thickness of the cover part is increased, and as the number of stacked internal electrodes is increased to implement a high capacitance multilayer ceramic capacitor, the difference in the heat shrinkage rate between the active part and the cover part may be increased.

The ceramic body 110 may be formed by sintering a green sheet multilayer body in which green sheets on which an internal electrode paste is printed and green sheets on which the internal electrode paste is not printed are stacked.

The green sheets on which the internal electrode paste is printed may form the active part 150, and the green sheets on which the internal electrode paste is not printed may form the cover part 160.

The green sheet may contain a dielectric powder configuring the ceramic body and a binder binding dielectric powder particles and may further contain other solvents, other additives, and the like. The binder may contain a resin composition such as an epoxy resin.

The binder or other organic ingredients including carbon, which are ingredients required to be removed at the time of sintering the green sheet multilayer body, may be bound to oxygen during a sintering process and discharged to the outside in the form of carbon dioxide ($CO_2$), or the like, to thereby be removed.

During a process of sintering the green sheet multilayer body to form the ceramic body, vertical cracks may occur due to a difference in the heat shrinkage rate between the active part 150 formed using the green sheets on which the internal electrode paste is printed and the cover part 160 formed using the green sheets on which the internal electrode paste is not printed, at the time of sintering.

The vertical cracks, which may occur during a process of implementing the multilayer ceramic electronic component, may deteriorate reliability to thereby cause a serious problem such as a product defect.

Such a problem may be further increased in a case in which a thickness of the cover part 160 is increased due to thinness of the internal electrode and the number of stacked internal electrodes is increased to implement the high capacitance multilayer ceramic capacitor.

In the case of the multilayer ceramic electronic component according to an embodiment in the present disclosure, the cover part 160 includes the buffer layer 123, such that even when the thickness of the cover part 160 is increased, a difference in the heat shrinkage rate between the active part 150 and the cover part 160 in the ceramic body may be efficiently controlled, thereby decreasing the occurrence of the vertical cracks in the ceramic body.

The buffer layer 123 may be disposed in at least one of the upper and lower cover parts 161 and 162.

For example, the buffer layer 123 may be disposed in both of the upper and lower cover parts 161 and 162, but is not limited thereto.

In this case, at the time of sintering the ceramic body 110, the occurrence of the vertical cracks in both of the upper and lower cover parts 161 and 162 may be prevented, such that reliability may be further secured.

Figure 3:
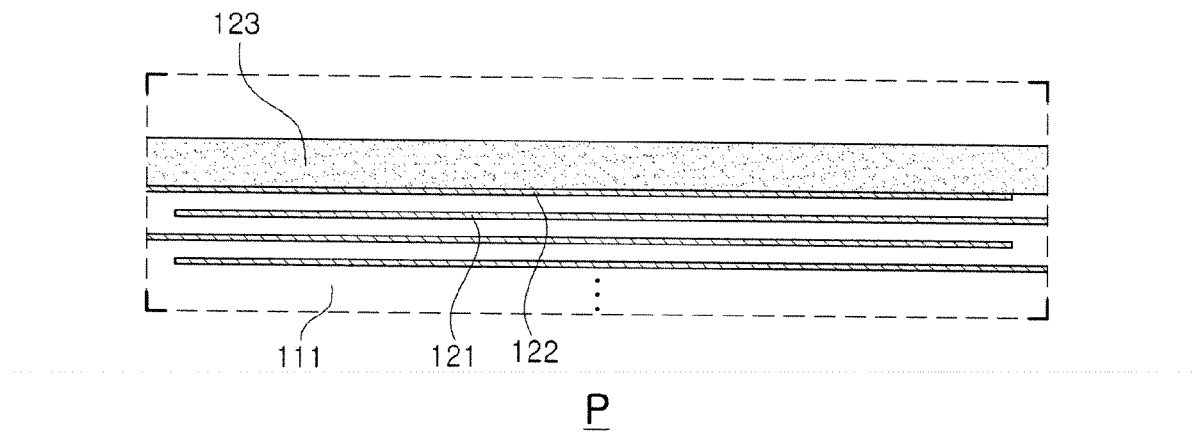
FIG. 3 is an enlarged view of part P of FIG. 2.

FIG. 3 is an enlarged view of part P of FIG. 2.

Referring to FIG. 3, in the multilayer ceramic electronic component according to an embodiment in the present disclosure, the buffer layer 123 may contain a conductive metal in a content of 1 to 40 vol %.

The conductive metal may be the same as a material contained in the internal electrodes 121 and 122 and may be, for example, nickel (Ni), copper (Cu), palladium (Pd), or an alloy thereof, but is not limited thereto.

According to an embodiment in the present disclosure, since the buffer layer 123 contains the conductive metal in a content of 1 to 40 vol %, the difference in the heat shrinkage rate between the active part 150 and the cover part 160 may be controlled at the time of sintering the ceramic body 110 including the active part 150 and the cover part 160.

In the case of a general multilayer ceramic electronic component, since the buffer layer containing a conductive metal in a content of 1 to 40 vol % is not disposed in a cover part, at the time of sintering, vertical cracks may occur in a ceramic body due to a difference in a heat shrinkage rate between dielectric layers and internal electrodes.

However, according to an embodiment in the present disclosure, since the buffer layer 123 containing the conductive metal in a content of 1 to 40 vol % is disposed between the cover part 160 and the active part 150, in detail, the outermost internal electrodes 121 and 122 of the active part 150, the difference in the heat shrinkage rate between the active part 150 and the cover part 160 may be decreased, thereby preventing vertical cracks from occurring in the ceramic body at the time of sintering.

The buffer layer 123 may contain a ceramic material in addition to the conductive metal contained therein in a content of 1 to 40 vol %.

In detail, the ceramic material contained in the buffer layer 123 may be the same material as that contained in the dielectric layer of the active part 150 and the dielectric layer of the cover part 160.

The ceramic material may be, for example, a barium titanate ($BaTiO_3$) based material, a strontium titanate ($SrTiO_3$) based material, or the like, but is not limited thereto.

For example, the buffer layer 123 may contain a dielectric grain.

In addition, although not particularly limited, for example, the buffer layer 123 may be disposed in a position adjacent to the outermost internal electrode of the active part 150.

Therefore, the buffer layer 123 having an intermediate heat shrinkage rate between the heat shrinkage rates of the internal electrode and the dielectric layer is disposed between the outermost internal electrodes 121 and 122 of the active part 150 having a relatively highest heat shrinkage rate and the dielectric layer of the cover part 160 having smallest relatively lowest heat shrinkage rate at the time of sintering the ceramic body 110, such that a rapid difference in the heat shrinkage rate may be decreased, thereby preventing vertical cracks.

In the case in which the content of the conductive metal contained in the buffer layer 123 is less than 1 vol %, since the volume content of the conductive metal contained in the buffer layer 123 is excessively small, a control of the difference in the heat shrinkage rate between the active part 150 and the cover part 160 at the time of sintering the ceramic body, 110, which is to be able to be obtained in an exemplary embodiment in the present disclosure, may not be performed.

Meanwhile, in the case in which the content of the conductive metal contained in the buffer layer 123 is more than 40 vol %, since the volume content of the conductive metal contained in the buffer layer 123 is excessively large, a short-circuit defect may occur.

In detail, in the case in which the content of the conductive metal contained in the buffer layer 123 is more than 40 vol %, the conductive metal may be lumped to thereby be connected to both end surfaces of the ceramic body 110 in the length direction. In this case, electric conductivity may be rapidly increased, such that short-circuit defects may occur.

For example, according to an embodiment in the present disclosure, the conductive metal contained in the buffer layer 123 may be insulated from both end surfaces of the ceramic body 110 in the length direction.

Figure 4:
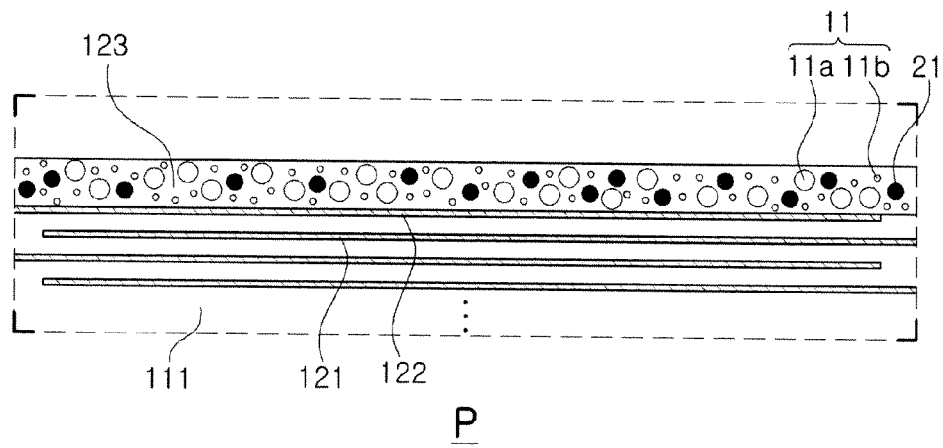
FIG. 4 is an enlarged view of part P of FIG. 2 according to an exemplary embodiment in the present disclosure.

FIG. 4 is an enlarged view of part P of FIG. 2 according to another embodiment in the present disclosure.

Referring to FIG. 4, in a multilayer ceramic electronic component according to another embodiment in the present disclosure, a buffer layer 123 may contain a dielectric grain 11a contained in a dielectric layer 111 of an active part 150 and a dielectric grain 11b contained in internal electrodes 121 and 122.

For example, the buffer layer 123 may contain the dielectric grain 11a contained in the dielectric layer 111 of the active part 150 and the dielectric grain 11b having an average grain size smaller than that of the dielectric grain 11a and contained in the internal electrodes 121 and 122.

According to another embodiment in the present disclosure, the buffer layer 123 contains heterogeneous dielectric grains 11a and 11b having different sizes and a conductive metal 21, such that a difference in a heat shrinkage rate between the active part 150 and a cover part 160 may be controlled at the time of sintering.

The heat shrinkage rate of the buffer layer 123 may be higher than that of upper and lower cover parts 161 and 162 and be lower than that of the outermost internal electrodes 121 and 122 of the active part 150.

According to another embodiment in the present disclosure, the buffer layer 123 contains the dielectric grain 11a contained in the dielectric layer 111 of the active part 150, the dielectric grain 11b having an average grain size smaller than that of the dielectric grain 11a and contained in the internal electrodes 121 and 122, and the conductive metal 21, such that the difference in the heat shrinkage rate between the active part 150 and the cover part 160 may be effectively controlled.

For example, the buffer layer 123 contains dielectric grains 11 having different sizes as well as the conductive metal 21, and a content ratio of the dielectric grain having a respective size in the dielectric grains 11 having different sizes is controlled, such that it may be easy to control the buffer layer 123 so as to have a heat shrinkage rate of an intermediate level between those of the heat shrinkage rates of the active part 150 and the cover part 160.

According to another embodiment in the present disclosure, there is provided a multilayer ceramic electronic component 100 including a ceramic body 110 including an active part 150 in which dielectric layers 111 and internal electrodes 121 and 122 are alternately disposed, an upper cover part 161 disposed on an upper portion of the active part 150, and a lower cover part 162 disposed on a lower portion of the active part 150; a shrinkage control part 123 disposed in at least one of the upper and lower cover parts 161 and 162; and external electrodes 131 and 132 disposed on both end surfaces of the ceramic body 110. Here, the shrinkage control part 123 may contain dielectric grains 11 and a conductive metal 21.

Except for the description described above, a description of features overlapped with those of the above-mentioned multilayer ceramic electronic component according to the foregoing embodiment in the present disclosure will be omitted.

Experimental Example

Multilayer ceramic electronic components according to an exemplary embodiment in the present disclosure and a comparative example were manufactured as follows.

A slurry containing a powder such as barium titanate ($BaTiO_3$), or the like, was applied to a carrier film to then be dried thereon so as to prepare a plurality of ceramic green sheets.

Then, an internal electrode pattern was formed by applying a conductive paste for an internal electrode containing nickel on portions of the ceramic green sheets by a screen printing method.

In addition, the ceramic green sheet forming a cover part, on which the internal electrode pattern was not printed, and a sheet for the formation of a buffer layer, formed by mixing the ceramic slurry and the conductive paste for an internal electrode with each other, were prepared.

The sheet for forming a buffer layer was manufactured using a slurry containing a powder such as barium titanate ($BaTiO_3$), or the like, and nickel. Here, the nickel was controlled so as to be contained therein in a content of 1 to 40 vol % after sintering.

Next, the ceramic green sheets on which an internal electrode was printed and the ceramic green sheets on which the internal electrode was not printed were stacked, but the sheet for forming a buffer layer was additionally stacked between the sheets, and then, the stacked sheets were isostatically pressed.

The ceramic multilayer body subjected to the isostatic pressing was cut in the form of individual chips so that one ends of the internal electrode patterns were alternately exposed to cut surfaces, and the chip provided through the cutting was subjected to a de-binding process.

Thereafter, the cut chip was sintered, thereby forming a ceramic body.

After sintering, a size of the ceramic body was 1.6 mm×0.8 mm×0.8 mm (length×width×thickness (L×W×T), a 1608 size, error range: ±0.1 mm).

In the manufactured ceramic body, a thickness of an active part was about 0.5 mm, a thickness of a dielectric layer included in the active part was about 1.3 μm, and a thickness of an internal electrode was about 1.0 μm.

In the manufactured ceramic body, thicknesses of upper and lower cover parts were about 0.15 mm, respectively, and a thickness of a buffer layer was about 1.5 μm.

In a comparative example compared with an exemplary embodiment in the present disclosure, a multilayer ceramic capacitor was manufactured by the same method as in the method for manufacturing a multilayer ceramic capacitor as described above except that a sheet for forming a buffer layer was not manufactured, and ceramic green sheets for forming an active part on which the internal electrode was printed and ceramic green sheets for forming a cover part on which the internal electrode was not printed were stacked.

Board for Mounting of Multilayer Ceramic Electronic Component

Figure 5:
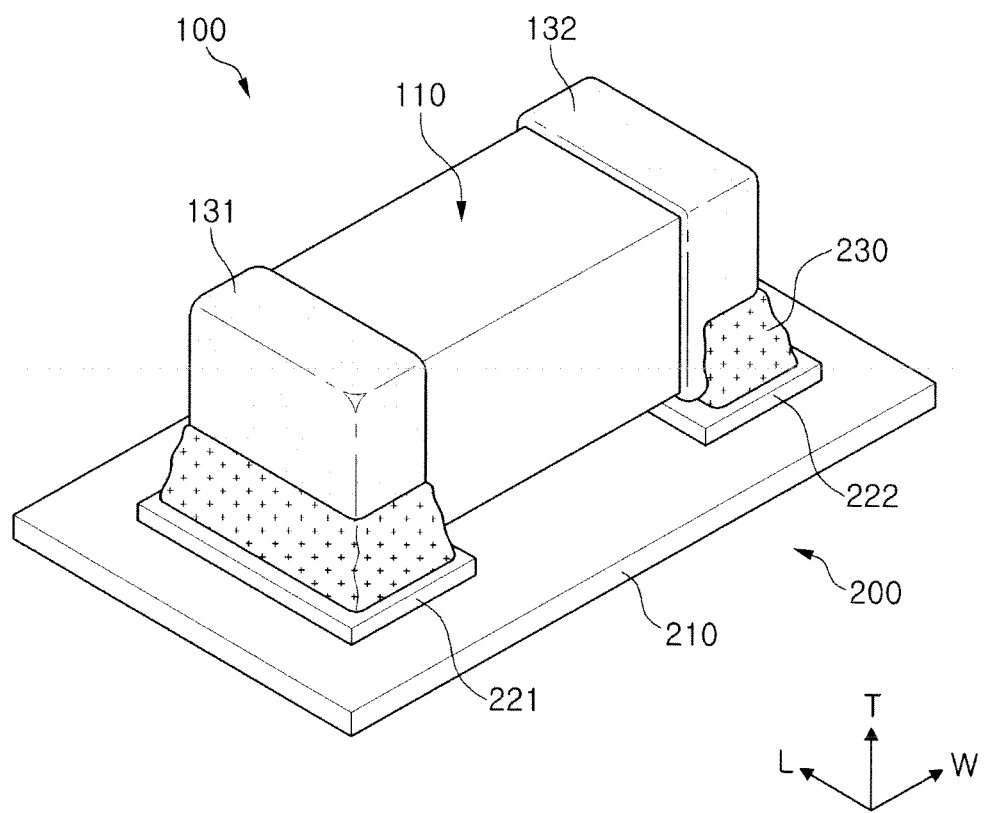
FIG. 5 is a perspective view illustrating a form in which the multilayer ceramic electronic component of FIG. 1 is mounted on a printed circuit board.

FIG. 5 is a perspective view illustrating a form in which the multilayer ceramic electronic component of FIG. 1 is mounted on a printed circuit board.

Referring to FIG. 5, a board 200 for mounting of a multilayer ceramic electronic component 100 according to the embodiment in the present disclosure may include a printed circuit board 210 on which internal electrodes of the multilayer ceramic electronic component 100 is horizontally mounted, and first and second electrode pads 221 and 222 disposed on the printed circuit board 210 to be spaced apart from each other.

In this case, the multilayer ceramic electronic component 100 may be electrically connected to the printed circuit board 210 by solder 230 in a state in which first and second external electrodes 131 and 132 are positioned on the first and second electrode pads 221 and 222 so as to contact each other.

Except for the description described above, a description of features overlapped with those of the above-mentioned multilayer ceramic electronic component according to the foregoing embodiment in the present disclosure will be omitted.

According to embodiments in the present disclosure, the difference in the heat shrinkage rate between the active part and the upper and lower cover parts in the ceramic body may be controlled at the time of sintering, such that the high reliability multilayer ceramic electronic component in which the occurrence of vertical cracks and cracks of the active part and the cover part may be reduced may be provided.

While exemplary embodiments have been shown and described above, it will be apparent to those skilled in the art that modifications and variations could be made without departing from the scope of the invention as defined by the appended claims.

What is claimed is:

1. A multilayer ceramic electronic component comprising:
   a ceramic body including an active part in which dielectric layers and internal electrodes are alternately disposed, an upper cover part disposed on the active part, and a lower cover part disposed below the active part;
   a buffer layer disposed in at least one of the upper and lower cover parts; and
   external electrodes disposed on end surfaces of the ceramic body,
   wherein the buffer layer contains a conductive metal in a content of 1 to 40 vol %, is disposed between an outermost internal electrode of the active part and a dielectric layer of the at least one of the upper and lower cover parts, and is in contact with the outermost internal electrode of the active part,
   wherein the buffer layer contains a first dielectric grain contained in the dielectric layer of the active part and a second dielectric grain having an average grain size smaller than that of the first dielectric grain contained in the dielectric layer of the active part, and wherein the first and second dielectric grains are both in contact with the outermost internal electrode and the at least one of the upper and lower cover parts.

2. The multilayer ceramic electronic component of claim 1, wherein a rate directly proportional to a thermal expansion coefficient of the buffer layer is higher than that of the upper and lower cover parts and lower than that of the outermost internal electrode of the active part.

3. A board for mounting of a multilayer ceramic electronic component comprising:
   a printed circuit board provided with first and second electrode pads formed on the printed circuit board; and
   the multilayer ceramic electronic component of claim 1, mounted on the printed circuit board.

4. A multilayer ceramic electronic component comprising:
   a ceramic body including an active part in which dielectric layers and internal electrodes are alternately disposed, an upper cover part disposed on the active part, and a lower cover part disposed below the active part;
   a shrinkage control part disposed in at least one of the upper and lower cover parts; and
   external electrodes disposed on end surfaces of the ceramic body,
   wherein the shrinkage control part contains a conductive metal, is disposed between an outermost internal electrode of the active part and a dielectric layer of the at least one of the upper cover and lower cover parts, and is in contact with the outermost internal electrode of the active part,
   wherein the shrinkage control part contains a first dielectric grain contained in the dielectric layer of the active part and a second dielectric grain having an average grain size smaller than that of the first dielectric grain contained in the dielectric layer of the active part,
   wherein the first and second dielectric grains are both in contact with the outermost internal electrode and the at least one of the upper and lower cover parts, and
   wherein a content of the conductive metal contained in the shrinkage control part is 1 to 40 vol %.

5. The multilayer ceramic electronic component of claim 4, wherein a rate directly proportional to a thermal expansion coefficient of the shrinkage control part is higher than that of the upper and lower cover parts and lower than that of the outermost internal electrode of the active part.

6. A board for mounting of a multilayer ceramic electronic component comprising:
   a printed circuit board provided with first and second electrode pads formed on the printed circuit board; and
   the multilayer ceramic electronic component of claim 4, mounted on the printed circuit board.

* * * * *